United States Patent
Yamamoto et al.

(10) Patent No.: US 7,901,587 B2
(45) Date of Patent: Mar. 8, 2011

(54) MANUFACTURING METHOD FOR VIBRATOR

(75) Inventors: Izumi Yamamoto, Sayama (JP); Tomoo Ikeda, Tokorozawa (JP)

(73) Assignee: Citizen Holdings Co. Ltd., Tokyo (JP)

( * ) Notice: Subject to any disclaimer, the term of this patent is extended or adjusted under 35 U.S.C. 154(b) by 669 days.

(21) Appl. No.: 11/662,540

(22) PCT Filed: Sep. 16, 2005

(86) PCT No.: PCT/JP2005/017157
§ 371 (c)(1),
(2), (4) Date: Mar. 12, 2007

(87) PCT Pub. No.: WO2006/030900
PCT Pub. Date: Mar. 23, 2006

(65) Prior Publication Data
US 2008/0067144 A1     Mar. 20, 2008

(30) Foreign Application Priority Data
Sep. 17, 2004   (JP) ................. 2004-270906

(51) Int. Cl.
*B44C 1/22* (2006.01)
*C03C 15/00* (2006.01)
*C03C 25/68* (2006.01)
*C23F 1/00* (2006.01)

(52) U.S. Cl. .............................................. 216/58

(58) Field of Classification Search .................. None
See application file for complete search history.

(56) References Cited

U.S. PATENT DOCUMENTS 5,137,700 A * 8/1992 Sloan ............................. 423/32

FOREIGN PATENT DOCUMENTS

| JP | 5-315881 | | 11/1993 |
|---|---|---|---|
| JP | 2002-076806 | | 3/2002 |
| JP | 2002076806 | A * | 3/2002 |
| JP | 2003-347885 | | 12/2003 |
| JP | 3543772 | | 4/2004 |
| JP | 2004-254173 | | 9/2004 |

OTHER PUBLICATIONS

Fumitaka et al, JP 2002-076806 Machine Translation.*
Osamu, JP 2003-347885 Machine Translation.*
Hideaki, JP 2002-261557, Machine Translation.*

* cited by examiner

*Primary Examiner* — Nadine G Norton
*Assistant Examiner* — Stephanie Duclair
(74) *Attorney, Agent, or Firm* — Smith, Gambrell & Russell, LLP

(57) ABSTRACT

After an external shape of a photoresist layer is patterned with use of a Cr film as an underlayer, i.e., a metal film to serve as an anticorrosive film that resists crystal etching, and an Au film as a surface layer, the Au film is etched. After groove portions are then patterned, the Cr film is etched. Since no degenerated-surface layer cannot be formed on the photoresist layer with an etchant for the Au film, the groove portions can be patterned without any degenerated-surface layer according to this method, so that high-accuracy groove portions can be formed.

7 Claims, 13 Drawing Sheets

MANUFACTURING METHOD FOR VIBRATOR

TECHNICAL FIELD

The present invention relates to a manufacturing method for a vibrator formed of a vibrating piece of rock crystal or the like.

BACKGROUND ART

In recent years, vibrators for use as time standards for electronic devices have started to be expected so that their vibrators are of small sizes and have a small CI-value (crystal impedance or equivalent series resistance). Conventionally, known vibrators that meet this requirement, e.g., tuning fork-type crystal vibrators, include one that is constructed in the manner shown in FIGS. 7A and 7B (see Japanese Patent Application Laid-Open No. 2002-76806, for example).

The tuning fork-type crystal vibrator described in the above patent document has two vibrating tines 13 that constitute a tuning fork, and groove portions 9 or slots are formed on the respective obverse and reverse surfaces of the tines 13. As shown in FIG. 7B, each tine 13 has a substantially H-shaped cross section. Drive electrodes are formed on the respective inner wall surfaces of the groove portions 9. This tuning fork-type crystal vibrator having a substantially H-shaped cross section is characterized in that the CI-value can be restricted to a low range, since its electromechanical conversion factor can be enhanced despite its size smaller than that of a conventional vibrator.

Processes for the manufacture of the tuning fork-type crystal vibrator with a substantially H-shaped cross section will now be described with reference to FIGS. 8A to 10D (see Japanese Patent Application Laid-Open No. 2002-76806 described above).

First, a crystal substrate 1 is worked into a plate-like structure, as shown in FIG. 8A. Then, metal films, a Cr film 3 and an Au film 5, are formed on the obverse and reverse surfaces of the crystal substrate 1 by sputtering (FIG. 8B). A photoresist layer 7 is formed on the metal films formed in this manner (FIG. 8C). Then, the external shape of the tuning fork-type crystal vibrator is exposed and developed with use of a photomask, and patterning is performed so that the photoresist layer 7 remains on the inside of the external shape of the tuning fork-type crystal vibrator and that the outside metal film, an unnecessary part, is exposed (FIG. 8D). FIG. 8D is a sectional view showing portions corresponding to the vibrating tines 13 of the tuning fork-type crystal vibrator.

Then, the exposed metal films, the Au film 5 and the Cr film 3, are etched away in the order named (FIG. 9A). After the entire remaining photoresist layer 7 is then exfoliated (FIG. 9B), a photoresist is applied again to the entire surface of the crystal substrate 1, whereupon a new photoresist layer 7 is formed (FIG. 9C). Then, the new photoresist layer 7 is exposed to the external shape of the tuning fork-type crystal vibrator and the shape of the groove portions 9 of the vibrating tines 13 with use of a photomask and developed, whereupon the surface of the unnecessary part of the crystal substrate 1 outside the external shape of the tuning fork-type crystal vibrator and the metal films of the groove portions 9 are exposed (FIG. 9D).

Then, the crystal substrate 1 that is exposed with the etchant for crystal etching is etched. As a result of the etching, the external shape of the tuning fork-type crystal vibrator is formed (FIG. 10A). Subsequently, the metal films (Au film 5 and Cr film 3) are etched with the remaining photoresist layer 7 used as a mask, and the metal films, the Au film 5 and the Cr film 3, exposed in the groove portions are removed in the order named (FIG. 10B). Then, the crystal substrate 1 that is exposed corresponding to the groove portions 9 is etched to a predetermined depth with the etchant for crystal etching, whereupon the groove portions 9 are formed (FIG. 10C). Then, the finally remaining photoresist layer 7 and the metal films are removed, whereupon the shape of the tuning fork-type crystal vibrator with a substantially H-shaped cross section is completed (FIG. 10D). Thereafter, electrodes are formed on the vibrator shown in FIG. 10D, whereupon the tuning fork-type crystal vibrator with a substantially H-shaped cross section is completed.

In the manufacturing method described above, however, the photoresist layer 7 must be formed and exfoliated twice, so that more complicated processes are required than in a manufacturing method for an ordinary tuning fork-type crystal vibrator without any grooves in its cross section, and the operating efficiency is poor. Further, the secondarily formed photoresist layer 7 (FIG. 9C) is exposed again for the external shape with use of the photomask for the formation of the groove portions different from the photomask for the primarily formed external shape. Accordingly, there is a problem that misalignment is caused between the primarily formed metal films (Au film 5 and Cr film 3) and the new photoresist film. Thus, a technique to improve this problem is proposed in Japanese Patent Application Laid-Open No. 2002-261557.

Disclosed in this Japanese Patent Application Laid-Open No. 2002-261557 is a manufacturing method for a vibrating piece of an inverted-mesa AT-cut crystal. Referring now to FIGS. 11A to 13B, a case will be described in which this technique is applied to a tuning fork-type crystal vibrator in comparison with the present invention.

First, a crystal substrate 1 is prepared (FIG. 11A), and a Cr film 3 and an Au film 5 are formed on the obverse and reverse surfaces of the crystal substrate 1 by vapor deposition or sputtering (FIG. 11B). Then, a photoresist is applied to the surfaces of these metal films (Cr film 3 and Au film 5) to form a photoresist layer 7 (FIG. 11C). Then, the external shape of the tuning fork-type crystal vibrator is exposed and developed with use of a photomask, and patterning is performed so that the photoresist layer 7 remains on the inside of the external shape of the tuning fork-type crystal vibrator and that the outside metal film is exposed (FIG. 11D).

Then, the exposed metal films, the Au film 5 and the Cr film 3, are etched away in the order named (FIG. 12A). Subsequently, the remaining photoresist layer 7 is exposed again for the shape of the groove portions 9 with use of a photomask and developed, whereupon the metal films of the groove portions are exposed (FIG. 12B). Then, the exposed crystal substrate 1 is etched with the etchant for crystal etching. The external shape of the tuning fork-type crystal vibrator is formed as a result of the etching (FIG. 12C). Subsequently, the metal films are etched with the remaining photoresist layer 7 as a mask, and the metal films, the Au film 5 and the Cr film 3, exposed in the groove portions are removed in the order named (FIG. 12D).

Then, the crystal substrate 1 that is exposed corresponding to the groove portions is etched to a predetermined depth with the etchant for crystal etching, whereupon the groove portions 9 are formed (FIG. 13A). Then, the remaining photoresist layer 7 and the metal films are removed, whereupon the shape of the tuning fork-type crystal vibrator with a substantially H-shaped cross section is completed (FIG. 13B). Thereafter, electrodes (not shown) are formed on this crystal vibrator, whereupon the tuning fork-type crystal vibrator with a substantially H-shaped cross section is completed.

When the photoresist layer is exposed to the etchant for the metal films, according to the manufacturing method described above, the surface of the photoresist layer is degenerated to lower the exposure sensitivity, and a degenerated-surface layer is produced that cannot be dissolved by normal exposure and development. Proposed in the aforesaid Japanese Patent Application Laid-Open No. 2002-261557, therefore, is a method in which the exposure time for the exposure of the groove portions is extended, the degenerated-surface layer is removed by an alkaline solution, such as a developer, before the exposure of the groove portions, or the degenerated-surface layer is removed by dry etching using oxygen plasma before the exposure of the groove portions or before the development after the exposure.

However, the alternative prior art manufacturing method described above has the following problems. Since the photoresist layer is degenerated by the etchant for removing the metal films, the photoresist must be subjected to some treatment. There is a problem that the degenerated-surface layer of the photoresist layer 7 cannot be developed if an attempt is made to extend or even decouple the exposure time in order to compensate for the reduction of the exposure sensitivity of the degenerated-surface layer. If the exposure is prolonged, moreover, the exposure time is too long for the photoresist at an undegenerated region, so that the dimensional accuracy of patterns worsens inevitably.

If an attempt is made to remove the degenerated-surface layer of the photoresist layer by an alkaline solution, such as a developer, before the exposure, moreover, the degenerated-surface layer is hardly dissoluble in the alkaline solution, so that it is difficult to remove the degenerated-surface layer thoroughly.

According to the method in which the degenerated-surface layer is removed by dry etching using oxygen plasma, furthermore, the processes are complicated, and besides, the photoresist layer is unexpectedly exposed to ultraviolet rays generated from the oxygen plasma, so that the pattern accuracy of the groove portions 9 worsens.

DISCLOSURE OF THE INVENTION

Accordingly, the object of the present invention is to solve the above problems of the conventional vibrator manufacturing method, thereby providing a vibrator manufacturing method for a vibrator, capable of forming groove portions in a simple fashion and forming high-accuracy groove portions.

In order to solve the above problems, a manufacturing method according to the present invention for a vibrator having a groove portion on at least one surface thereof comprises: a step of forming a metal film composed of an underlayer and a surface layer on a surface of a substrate made of a piezoelectric material; a step of spreading a photoresist on the surface layer of the metal film, thereby forming a photoresist layer thereon; a step of patterning the photoresist layer into an external shape of the vibrator, thereby removing unnecessary parts of the photoresist layer; a step of etching away those parts of the surface layer which are exposed corresponding to the removed parts of the photoresist layer, thereby exposing the underlayer; a step of patterning the photoresist layer to remove the unnecessary parts of the photoresist layer without exfoliating the photoresist layer remaining on the surface layer, thereby exposing the surface layer corresponding to the groove portion; a step of etching away those parts of the underlayer which have so far been exposed in the preceding steps, thereby exposing the surface of the substrate; a step of etching away exposed parts of the substrate, thereby forming the external shape of the vibrator; a step of etching away those parts of the surface layer and the underlayer which correspond to the groove portion, thereby exposing the surface of the substrate; a step of etching the surface of the substrate exposed corresponding to the groove portion, thereby forming the groove portion; and a step of removing the remaining metal film of the surface layer and the underlayer.

The above manufacturing method for a vibrator may assume the following aspects.

The vibrator may be formed of a rock crystal.

Cr may be used for the metal film of the underlayer, and Au may be used for the metal film of the surface layer.

A solution containing iodine and potassium iodide may be used as an etchant for etching the metal film of the surface layer.

The vibrator may be a tuning fork-type vibrator having the groove portion on each vibrating tine portion.

The vibrator may be an inverted-mesa vibrator using the groove portion as a vibrating body.

According to the present invention, the metal films that are exposed by the first patterning of the photoresist layer are not removed thoroughly, that is, only the metal film of the surface layer is removed, and the metal film of the underlayer is left. Since the photoresist film is patterned again in this state, repatterning (exposure and development) can be performed without degenerating the remaining photoresist film. Further, there is no need of adding a new process for removing the degenerated-surface layer of the photoresist, and the exposure time need not be extended. Thus, the vibrator having recesses such as grooves can be obtained by simple processes.

According to the present invention, moreover, the degenerated-surface layer of the photoresist need not be removed, so that the vibrator with satisfactory pattern accuracy can be obtained without complication of the processes or reduction of the pattern accuracy of the grooves or other recesses attributable to the removal of the degenerated-surface layer.

BEST MODE FOR CARRYING OUT THE INVENTION

FIGS. 1A to 3D are views individually showing manufacturing processes for a vibrator according to the present invention.

Figure 1A:
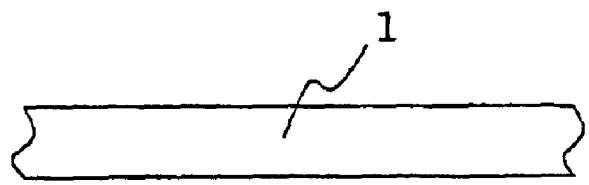
FIGS. 1A to 1D are illustrative views each sequentially showing a part of the manufacturing processes for the vibrator according to the manufacturing method of the present invention.
Figure 1B:
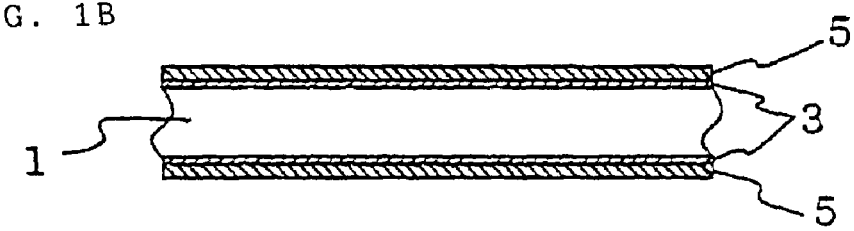

First, a crystal substrate 1 is worked into a plate-like structure (FIG. 1A). Then, a Cr film 3 of about 500 Å thickness is formed as a metal film for an underlayer on the obverse and reverse surfaces of the crystal substrate 1 by vapor deposition or sputtering. Subsequently, an Au film 5 of about 1,000 Å thickness is formed as a metal film for a surface layer on the underlayer (FIG. 1B). The Cr film 3 functions as an intermediate layer that improves the adhesion between Au film 5 and the crystal substrate 1. Further, the Au film 5 functions as an anticorrosive film that resists a liquid mixture of hydrofluoric acid and an ammonium fluoride solution used afterward in etching crystal.

Figure 1C:
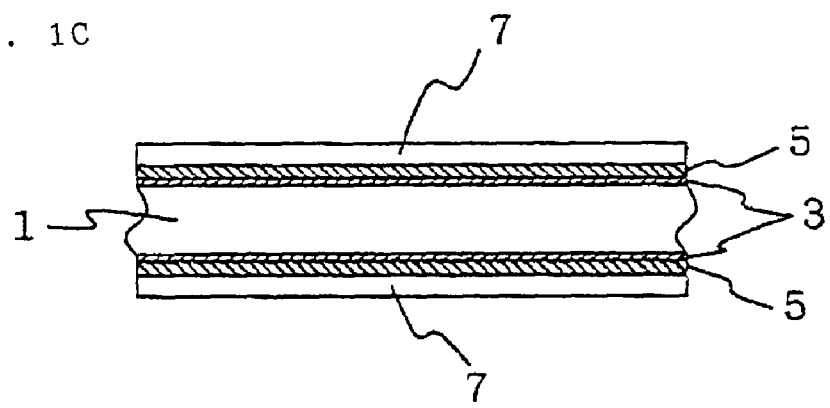
Figure 1D:
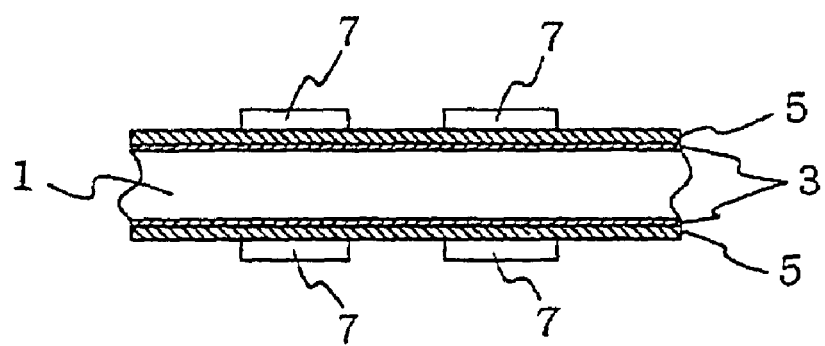

Then, a photoresist is applied to the surface of the Au film 5 and dried to form a photoresist layer 7 (FIG. 1C). For example, OFPR (trademark), a positive photoresist from Tokyo Ohka Kogyo Co., Ltd., is used as the photoresist. Then, exposure and development are performed with use of a photomask for forming the external shape of a tuning fork-type crystal vibrator so that the photoresist layer 7 remains only on the inside of the external shape of the tuning fork-type crystal vibrator and that the outside Au film 5 is exposed (FIG. 1D).

Figure 2A:
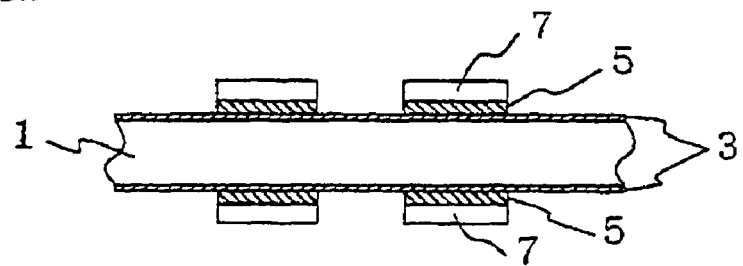
FIGS. 2A to 2D are continuations of the processes of FIGS. 1A to 1D.
Figure 2B:
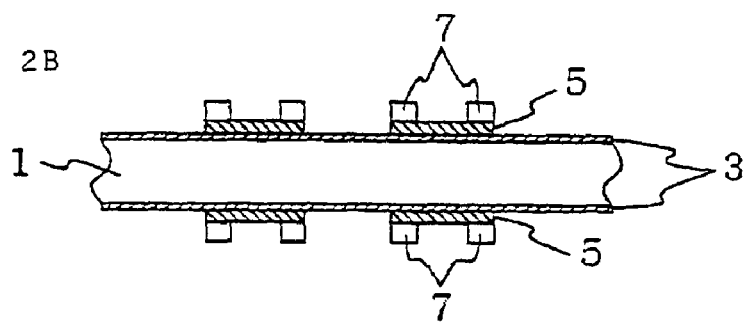
Figure 2C:
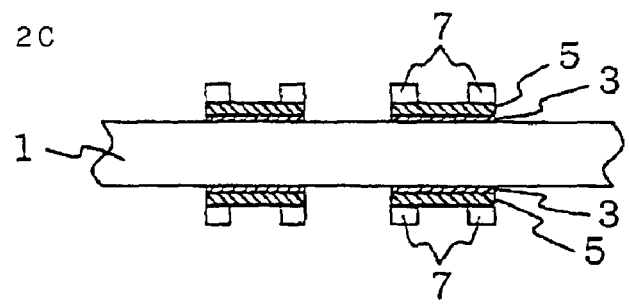

Then, the exposed Au film 5 is etched away (FIG. 2A). The Au film 5 is etched with an etchant that is formed by dissolving iodine in a potassium iodide solution. The Cr film 3 is exposed from those parts from which the Au film 5 is removed, and it is left as it is. Subsequently, groove portions of the remaining photoresist layer 7 are exposed and developed without exfoliation of the photoresist layer 7, whereby those parts of the photoresist layer 7 which correspond to the groove portions are removed (FIG. 2B). When this is done, the Au film 5 is exposed from those surfaces which correspond to the groove portions from which the photoresist layer 7 is removed. Then, the exposed Cr film 3 is etched away (FIG. 2C). The Cr film 3 is etched with an etchant that contains, for example, cerium ammonium nitrate.

Thus, according to the present invention, the groove portions are exposed and developed after the Au film 5 is etched (FIG. 2A), and the Cr film 3 is etched thereafter. This is done for the following reason. Conventionally, as mentioned before, the photosensitivity of the photoresist layer 7 is considerably lowered when the metal film as the anticorrosive film is exposed to the etchant, and a degenerated-surface layer is produced that cannot be exposed and developed with ease. However, a detailed experiment revealed that the photoresist layer 7 produced no degenerated-surface layer when the etchant used was the one formed by dissolving iodine in a potassium iodide solution. When the photoresist layer 7 was exposed to the etchant for the Cr film 3 that contains cerium ammonium nitrate, on the other hand, a degenerated-surface layer was found to be produced. Thus, if the groove portions are previously exposed and developed (FIG. 2B) without etching the Cr film 3 after the Au film 5 is etched, as in the present invention, therefore, the groove portions can be exposed and developed without any degenerated-surface layer on the photoresist layer 7. Thus, the groove portions can be exposed and developed on the photoresist layer 7 without requiring any special treatment.

Figure 2D:
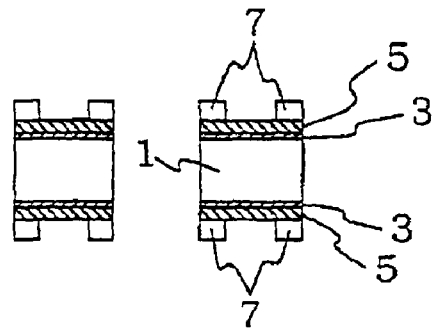
Figure 3A:
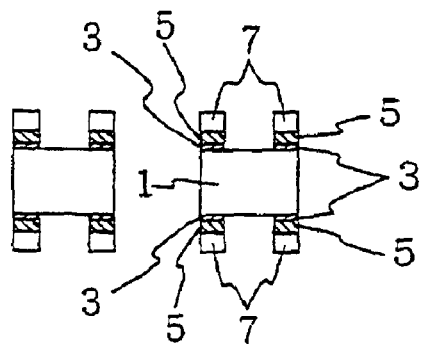
FIGS. 3A to 3D are continuations of the processes of FIGS. 2A to 2D.
Figure 3B:
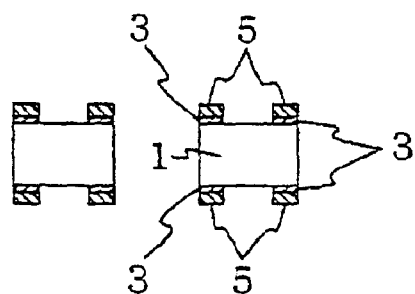
Figure 3C:
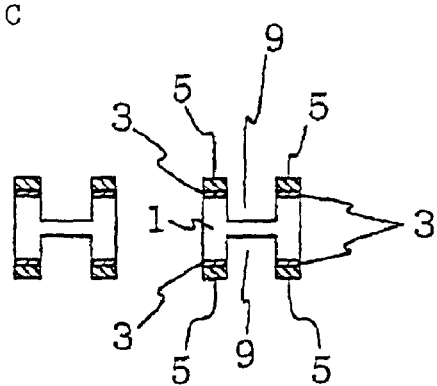
Figure 3D:
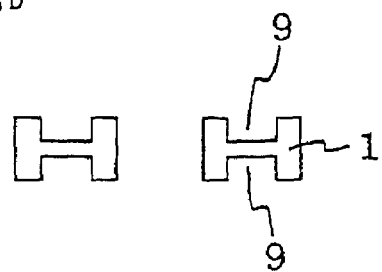

Then, the exposed crystal substrate 1 is etched with a liquid mixture of hydrofluoric acid and ammonium fluoride, which is an etchant for rock crystal, whereupon the external shape of the tuning fork-type crystal vibrator is formed (FIG. 2D). Subsequently, the Au film 5 and the Cr film 3 that are exposed in the groove portions are etched away in the order named (FIG. 3A). Then, the remaining photoresist layer 7 is exfoliated (FIG. 3B). Thereafter, those parts of the crystal substrate 1 which are exposed corresponding to the groove portions are etched with the liquid mixture of hydrofluoric acid and ammonium fluoride, which is an etchant for rock crystal, whereby groove portions 9 (recesses) of a predetermined depth are worked individually on the opposite surfaces, upper and lower (FIG. 3C). Finally, the Au film 5 and the Cr film 3 are removed to obtain the external shape of the tuning fork-type crystal vibrator with a substantially H-shaped cross section (FIG. 3D).

Although the groove portions are etched after the photoresist layer 7 is exfoliated in the example given above, the photoresist layer 7 may be removed after the groove portions are worked. Since the photoresist layer may be exfoliated during the groove portion etching, thereby affecting the groove portion etching, however, the photoresist layer 7 should preferably be removed before the groove portions are etched.

Figure 4:
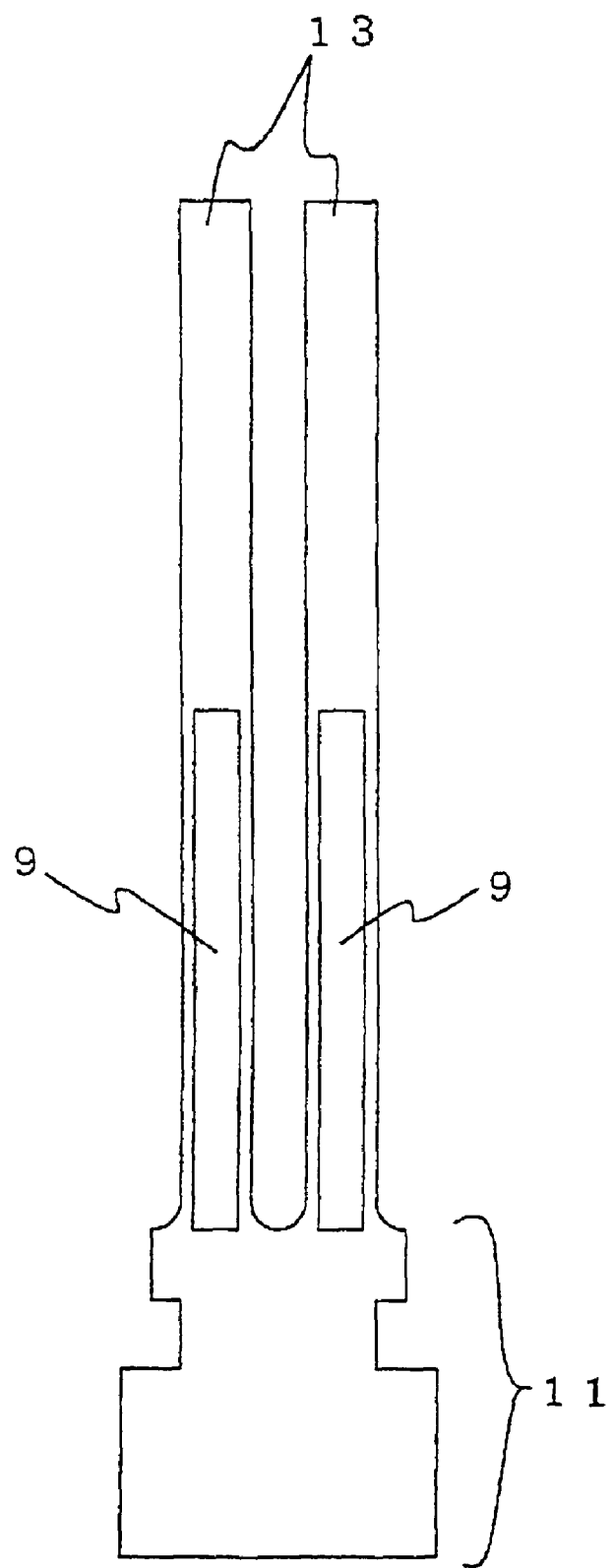
FIG. 4 is a view showing an external shape of an tuning fork-type crystal vibrator with a substantially H-shaped cross section manufactured by the manufacturing method according to the present invention.

In this manner, the external shape of the tuning fork-type crystal vibrator with a substantially H-shaped cross section is completed, as shown in FIG. 4. The tuning fork-type crystal vibrator with a substantially H-shaped cross section comprises a basal portion 11 and two vibrating tines 13 extending from the basal portion 11, and the groove portions 9 are individually provided on the obverse and reverse surfaces of the vibrating tines 13.

Figure 5:
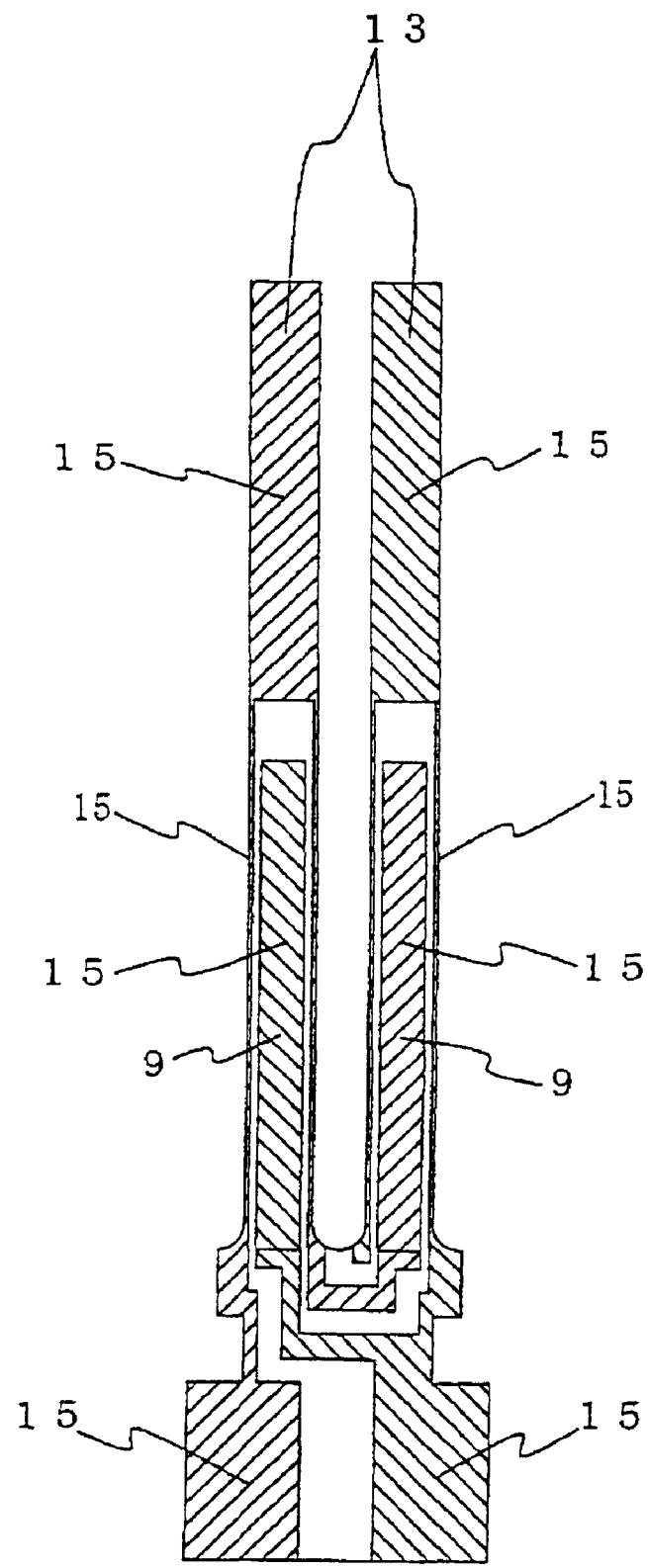
FIG. 5 is a view showing the tuning fork-type crystal vibrator with a substantially H-shaped cross section manufactured by the manufacturing method according to the present invention.

Processes for forming electrodes 15 shown in FIG. 5 will now be described with reference to FIG. 6. FIG. 5 is a plan view of a tuning fork-type crystal vibrator. The electrodes 15 are provided individually on the groove portions 9 of the vibrating tines 13, side faces, and the basal portion 11.

Figure 6A:
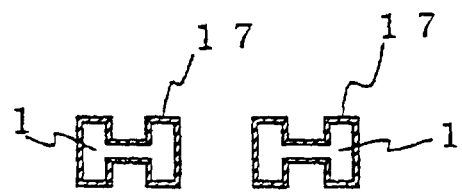
FIGS. 6A to 6E are illustrative views each showing an electrode forming process according to the manufacturing method according to the present invention.
Figure 6B:
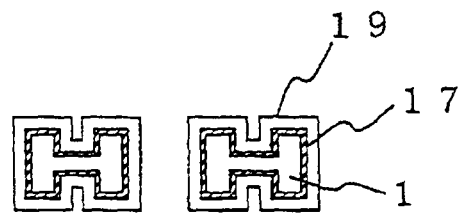
Figure 6C:
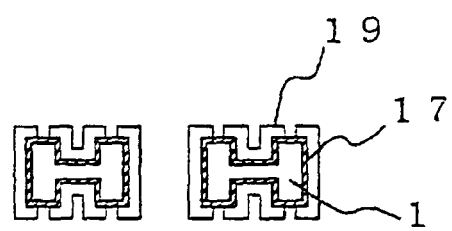
Figure 6D:
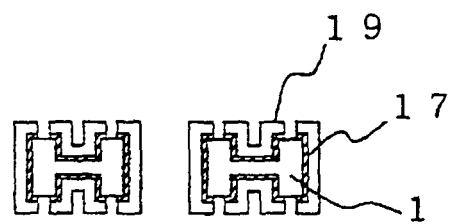
Figure 6E:
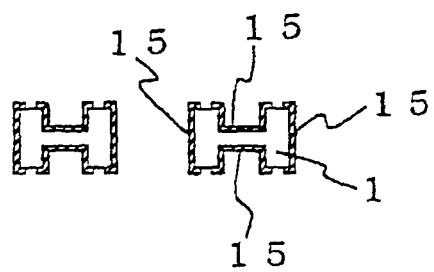
Figure 7A:
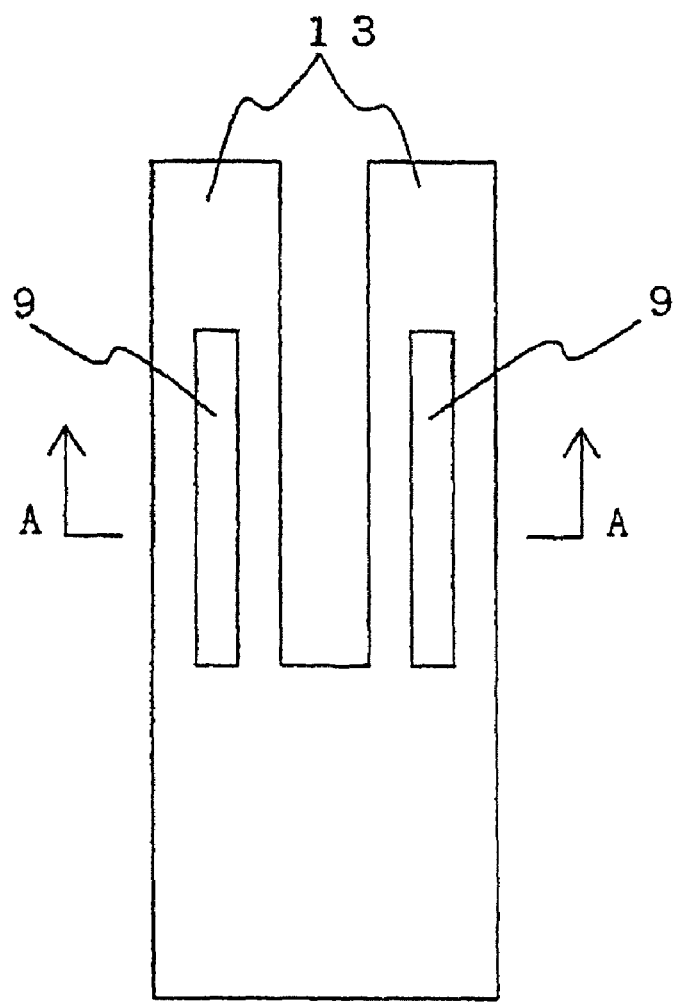
FIG. 7A is a top view showing an external shape of a tuning fork-type crystal vibrator with a substantially H-shaped cross section.
Figure 7B:
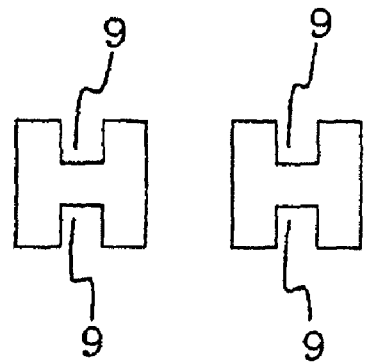
FIG. 7B is a view showing cross section (cross sections along A-A) of tines of the crystal vibrator of FIG. 7A.
Figure 8A:
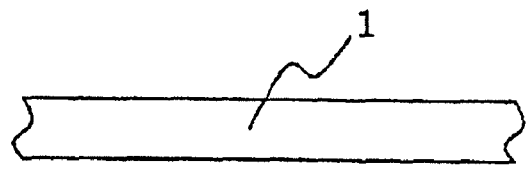
FIGS. 8A to 8D are illustrative views each sequentially showing a part of the manufacturing process according to the one conventional manufacturing method.
Figure 8B:
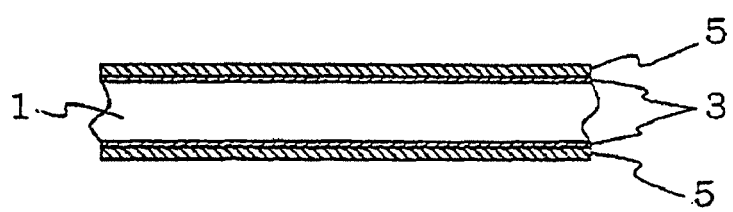
Figure 8C:
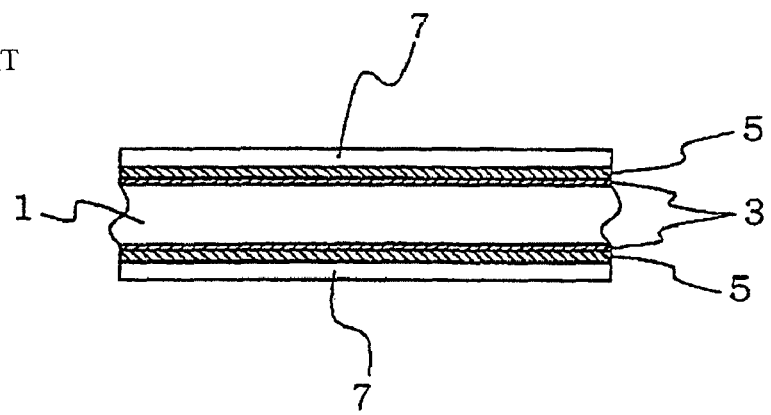
Figure 8D:
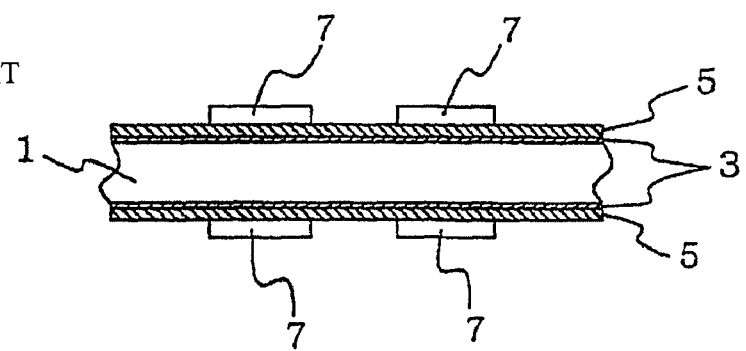
Figure 9A:
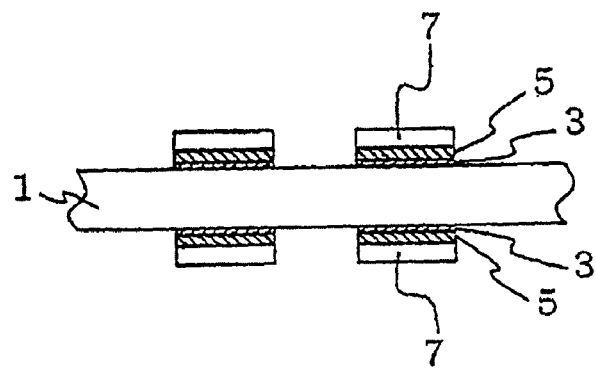
FIGS. 9A to 9D are continuations of the process of FIGS. 8A to 8D.
Figure 9B:
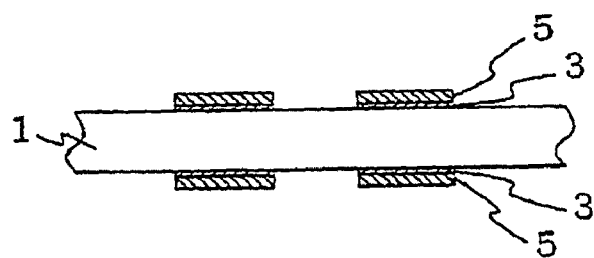
Figure 9C:
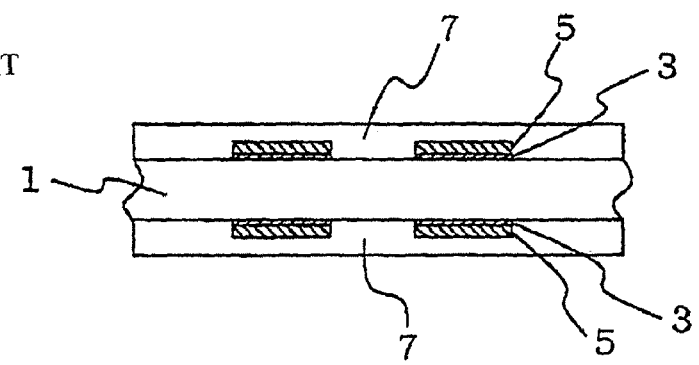
Figure 9D:
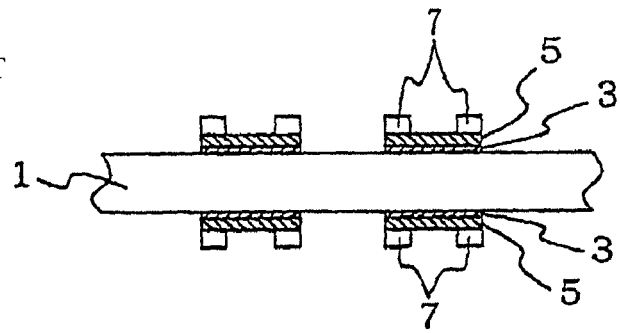
Figure 10A:
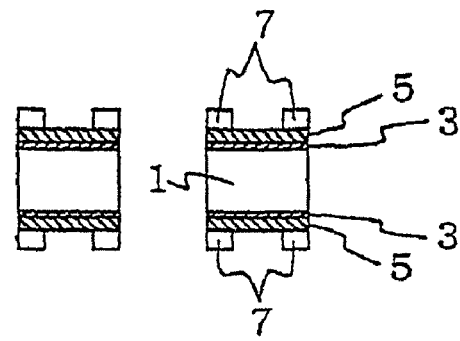
FIGS. 10A to 10D are continuations of the process of FIGS. 9A to 9D.
Figure 10B:
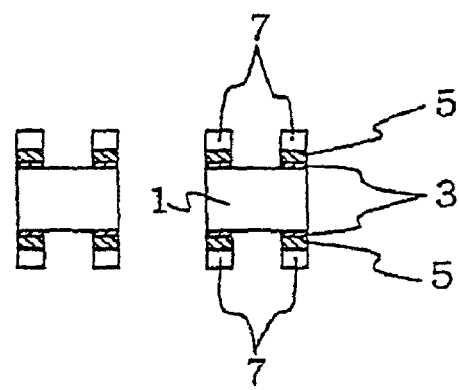
Figure 10C:
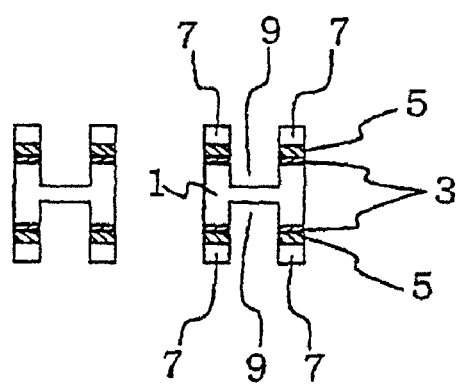
Figure 10D:
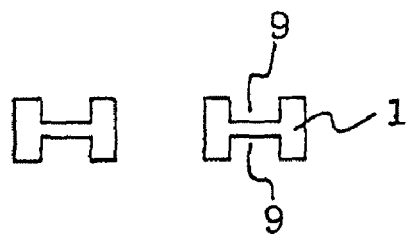
Figure 11A:
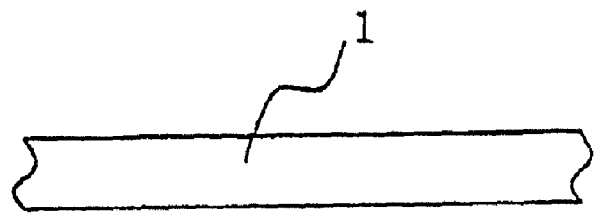
FIGS. 11A to 11D are illustrative views each sequentially showing a part of a manufacturing process according to an alternative conventional manufacturing method.
Figure 11B:
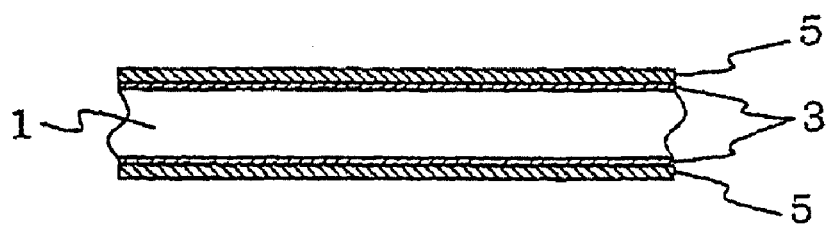
Figure 11C:
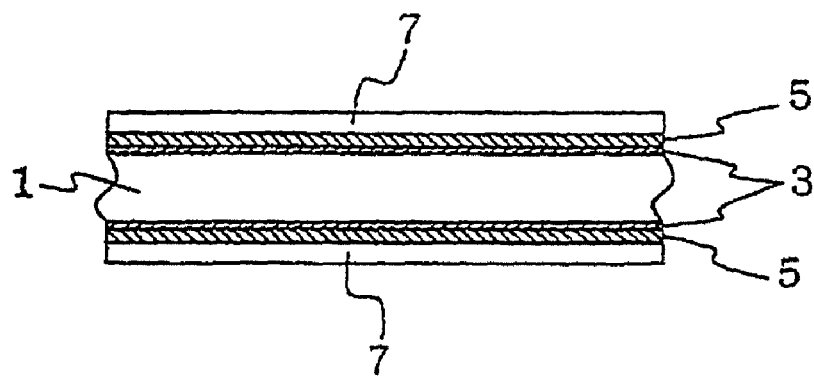
Figure 11D:
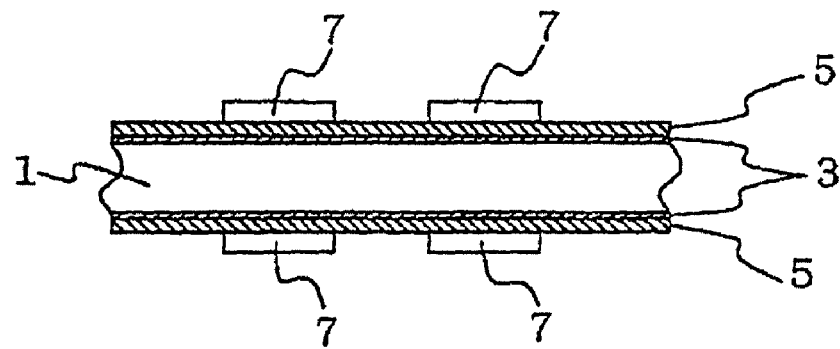
Figure 12A:
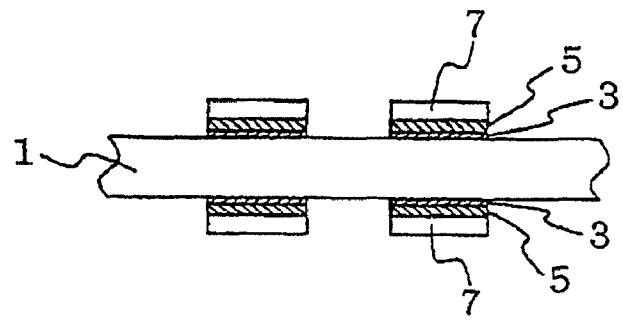
FIGS. 12A to 12D are continuations of the process of FIGS. 11A to 11D.
Figure 12B:
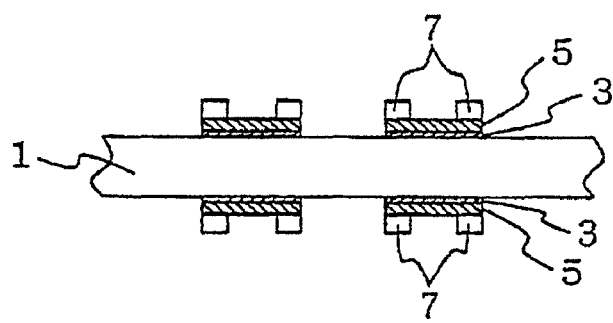
Figure 12C:
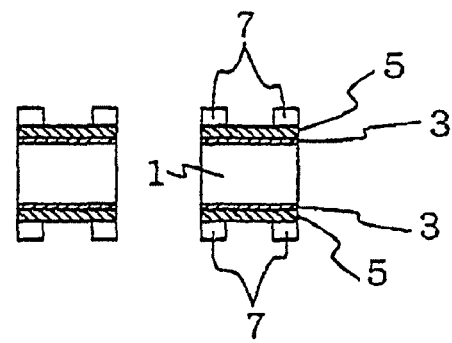
Figure 12D:
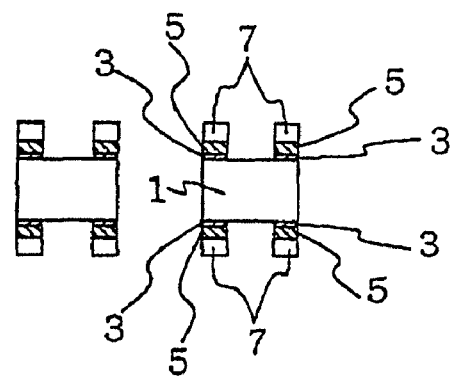
Figure 13A:
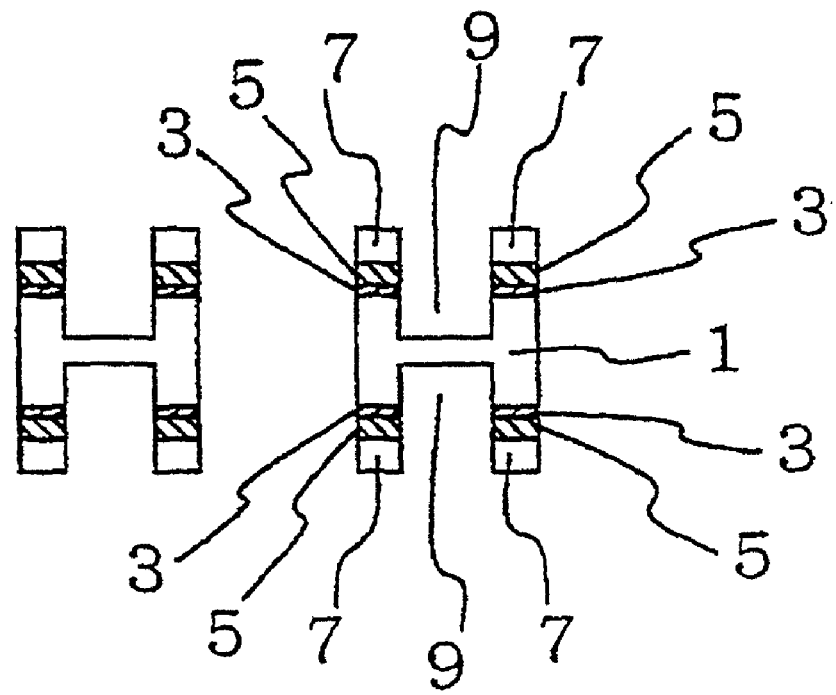
FIGS. 13A and 13B are continuations of the process of FIGS. 12A to 12D.
Figure 13B:
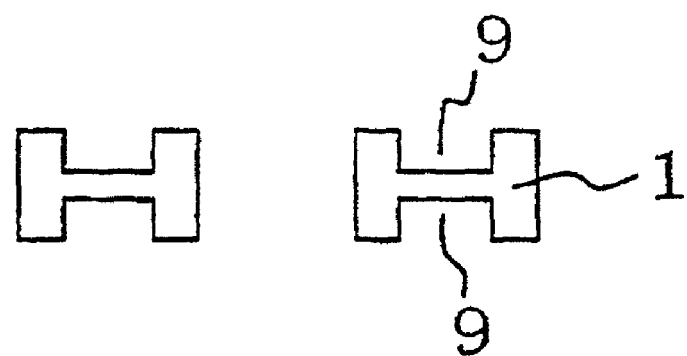

First, as shown in FIG. 6, a metal film 17 is formed on the entire surface of the substantially H-shaped tuning fork-type crystal vibrator by sputtering or the like (FIG. 6A). For example, a laminate film that is formed of a Cr film as an underlayer and an Au film as a surface layer is used as the metal film 17. Then, a photoresist layer 19 is formed on the surface of the metal film 17 (FIG. 6B). As this is done, the photoresist must be applied stereoscopically to the obverse surface, reverse surface, and side faces of the tuning fork-type crystal vibrator. This can be achieved by a spraying coating method using a spray coater or an electrocoating method in which an electrodeposition photoresist is applied with a metal film used as an electrode. Then, the pattern of the electrode is exposed and developed, and that part of the photoresist layer 19 which corresponds to the region without the electrodes 15 of FIG. 5 is removed (FIG. 6C). Then, that part of the metal film 17 which is exposed on the surface (FIG. 6D) is etched away, and the photoresist layer 19 is exfoliated (FIG. 6E). Thereupon, the electrodes 15 are formed, as shown in FIG. 5.

In the example given in the best mode for carrying out the invention described above, the vibrating tines of the tuning fork-type crystal vibrator have a substantially H-shaped cross section. However, the present invention is not limited to this example but may be also applied to a framed AT-cut plate crystal vibrator. In this case, a portion that constitutes a vibrating body has the shape of a recess that is surrounded by a frame and is thinner than the frame portion. It is to be understood the invention may be applied to an inverted-mesa vibrator of a so-called AT-cut plate crystal if the groove portions of the foregoing embodiment are replaced with the recess shape.

The invention claimed is:

1. A manufacturing method for a vibrator having a groove portion on at least one surface thereof, comprising:
   a step of forming a metal film composed of an underlayer and a surface layer on a surface of a substrate made of a piezoelectric material;
   a step of spreading a photoresist on the surface layer of the metal film, thereby forming a photoresist layer thereon;
   a step of patterning the photoresist layer into an external shape of the vibrator, thereby removing first unnecessary parts of the photoresist layer;
   a step of etching away those parts of the surface layer which are exposed corresponding to the removed first unnecessary parts of the photoresist layer, thereby exposing the underlayer;
   then, after exposing the underlayer, a step of patterning the photoresist layer to remove second unnecessary parts of the photoresist layer without exfoliating the photoresist layer remaining on the surface layer, thereby exposing the surface layer corresponding to the groove portion;
   then, after exposing the surface layer corresponding to the groove portion, a step of etching away those parts of the underlayer which have so far been exposed in the preceding steps which correspond to the removed first unnecessary parts of the photoresist layer, thereby exposing the surface of the substrate;
   a step of etching away exposed parts of the substrate, thereby forming the external shape of the vibrator;
   a step of etching away those parts of the surface layer and the underlayer which correspond to the removed second unnecessary parts of the photoresist layer in the groove portion, thereby exposing the surface of the substrate;
   a step of etching the surface of the substrate exposed corresponding to the groove portion, thereby forming the groove portion; and
   a step of removing the remaining surface layer and the underlayer of the metal film.

2. The manufacturing method for a vibrator according to claim 1, wherein the vibrator is formed of a rock crystal.

3. The manufacturing method for a vibrator according to claim 1 or 2, wherein Cr is used for the metal film of the underlayer, and Au is used for the metal film of the surface layer.

4. The manufacturing method for a vibrator according to claim 3, wherein a solution containing iodine and potassium iodide is used as an etchant for etching the surface layer of the metal film.

5. The manufacturing method for a vibrator according to claim 1, wherein the vibrator is a tuning fork-type vibrator having the groove portion on each vibrating tine portion.

6. The manufacturing method for a vibrator according to claim 1, wherein the vibrator is an inverted-mesa vibrator using the groove portion as a vibrating body.

7. A manufacturing method for a vibrator, comprising:
   a step of forming a Cr film on a surface of a crystal substrate, forming an Au film on a surface of the Cr film, and spreading a photoresist on the Au film, thereby forming a photoresist layer thereon;
   a step of patterning the photoresist layer into an external shape of the tuning fork-type vibrator, thereby removing first unnecessary parts of the photoresist layer;
   a step of etching away those parts of the Au film which are exposed corresponding to the first unnecessary removed parts of the photoresist layer, thereby exposing the Cr film;
   then, after exposing the Cr film, a step of patterning the photoresist layer into an external shape of a groove portion of each vibrating tine portion of the tuning fork-type vibrator to remove second unnecessary parts of the photoresist layer without exfoliating the photoresist layer remaining on the Au film, thereby exposing the Au film corresponding to the groove portion;
   then, after exposing the Au film corresponding to the groove portion, a step of etching away those parts of the Cr film which have so far been exposed in the preceding steps which correspond to the removed first unnecessary parts of the photoresist lager, thereby exposing the surface of the substrate;
   a step of etching away exposed parts of the substrate, thereby forming the external shape of the vibrator;
   a step of etching away those parts of the Au film and the Cr film which correspond to the removed second unnecessary parts of the photoresist layer in the groove portion, thereby exposing the surface of the substrate;
   a step of etching the surface of the substrate exposed corresponding to the groove portion, thereby forming the groove portion; and
   a step of removing the remaining Au film and Cr film.

* * * * *